United States Patent [19]

Karlquist

[11] Patent Number: 5,148,122
[45] Date of Patent: Sep. 15, 1992

[54] ATOMIC BEAM FREQUENCY STANDARD HAVING RF CHAIN WITH HIGHER FREQUENCY OSCILLATOR

[75] Inventor: Richard Karlquist, Cupertino, Calif.
[73] Assignee: Hewlett-Packard Company, Palo Alto, Calif.
[21] Appl. No.: 738,764
[22] Filed: Aug. 1, 1991
[51] Int. Cl.[5] .............................................. H03L 7/26
[52] U.S. Cl. ........................................ 331/3; 331/94.1
[58] Field of Search ................................... 331/3, 94.1
[56] References Cited
U.S. PATENT DOCUMENTS
3,670,171 6/1972 Lacey et al. .............................. 331/3

Primary Examiner—Siegfried H. Grimm

[57] ABSTRACT

An RF chain having a high-frequency oscillator providing first, second and third outputs. The first output is multiplied to provide a microwave signal to an atomic beam tube; the second output is divided to provide a standard output frequency; and the third output is divided to provide a first input to a phase detector. The phase detector receives a second input from a low-frequency oscillator which is controlled by a servo signal from the atomic beam tube. The output of the phase detector provides a control signal to the high-frequency oscillator.

7 Claims, 4 Drawing Sheets

ATOMIC BEAM FREQUENCY STANDARD HAVING RF CHAIN WITH HIGHER FREQUENCY OSCILLATOR

FIELD OF THE INVENTION

The present invention relates to frequency standards and more particularly to atomic clocks such as those based on cesium beam tubes.

BACKGROUND OF THE INVENTION

Many modern technological applications require precise frequency standards or clocks. For example, very precise navigational systems depend on clocks of extremely high accuracy. Atomic frequency standards form the basis for many such systems. One class of atomic beam standard that has found wide acceptance is based on a cesium beam tube. Cesium beam units are the present basis for most of the national standards of frequency and time. These standards are accurate to about a part in $10^{13}$.

Cesium beam standards utilize quantum effects arising from the nuclear magnetic hyperfine structure in the ground state of the cesium atom. The transition normally utilized arises from the electron-spin, nuclear-spin interaction. The transition in question is relatively insensitive to external influences such as electric and magnetic fields. This transition defines a frequency in the microwave region of the spectrum at 9,192,631,770 Hz.

Basically, the cesium beam tube provides an output that is very sensitive to the frequency of a microwave source that applies energy to the tube. The microwave source is tuned until the output of the tube is maximized. When this condition is satisfied, the frequency of the microwave source will be related in a known manner to the above-described transition frequency.

An ideal cesium beam tube operates as follows. A collimated beam of cesium atoms is passed through a magnetic state selector which selects cesium atoms in a first energy state. The selected atoms then traverse a microwave cavity in which the atoms absorb energy from or give energy to the microwave source. The absorbed or delivered energy causes some fraction of the atoms to make a transition to a second energy state. The number of atoms that made the transition is then determined in an analyzer. The frequency of the microwave source is continuously adjusted in a servo loop to maximize the output of the analyzer.

In prior art systems, the microwave frequency is generated by an RF chain which includes frequency multiplication of the output of a low-frequency voltage controlled oscillator. A 10 MHz crystal stabilized oscillator is often used. The servo loop operates on the low-frequency oscillator. The output of the low-frequency oscillator is typically split. Part of the output signal becomes the frequency standard which is provided by the system, the other part of the output signal is frequency multiplied and applied to a Cesium beam tube. This arrangement is dictated by lack of commercially practical crystal stabilized voltage controlled oscillators at frequencies in the 9 GHz region.

While the microwave frequency is closely correlated to the frequency of the above-mentioned transition, the frequency of the low frequency oscillator may fluctuate due to frequency pulling caused by variations in the loading of the frequency standard output. In addition, spurious signals from the circuit connected to this output can leak back into the atomic clock and corrupt the microwave signal by modulating it. In either case, frequency errors can result. To avoid these errors, isolation amplifiers are typically introduced between the signal splitting circuit and the external output. Unfortunately, such amplifiers can introduce a temperature sensitive phase shift which reduces the accuracy of the output during temperature changes, particularly when the output is being used as the basis of a high accuracy clock. Hence, a tradeoff is forced between errors caused by lack of isolation, and errors caused by side effects of having a lot of isolation.

A second problem with this prior art arrangement is the large difference between the system output and the microwave frequency. The large multiplication factor between the 10 MHz oscillator and the microwave generator reduces the degree of coherency between these two frequency sources. The multiplier circuits typically involve a number of tuned circuits having temperature sensitive components. Even with high stability inductors, the phase drift is significant. The phase drift in question increases with the degree of frequency multiplication. Ideally, the low-frequency oscillator should have a frequency closer to the 9 GHz microwave frequency, since a lower degree of multiplication would be needed.

A third problem with prior art cesium beam systems is the lack of multiple, well-isolated, phase coherent outputs. In principle, different output frequencies can be generated from the crystal stabilized oscillator by multiplying or dividing its frequency. However, the dividers introduce phase shift in the output signals depending on when the divider was started; hence, each time the frequency is shifted, a phase shift in the output signals, depending on when the divider is started, can be introduced. Such phase shifts are particularly troublesome in high precision clocks. In addition, only frequencies which are integer fractions of the 10 MHz oscillator frequency are obtained. Furthermore, there are a number of applications in which a standard frequency that is much greater than 10 MHz is desirable. To obtain such a standard frequency with prior art systems, frequency multiplication must be utilized. The same phase drift problems discussed above apply to such frequency multipliers.

Broadly, it is the object of the present invention to provide an improved RF chain for use in atomic clocks.

It is another object of the present invention to provide an RF chain that requires less frequency multiplication than prior art systems.

It is a further object of the present invention to provide an RF chain with improved output signal isolation without introducing temperature dependent phase shifts.

It is a still further object of the present invention to provide an RF chain having a selectable output signal frequency in which the output signal remains synchronized even when its frequency is shifted.

It is yet another object of the present invention to provide an RF chain that provides output frequencies above 10 MHz.

These and other objects of the present invention will become apparent to those skilled in the art from the following detailed description of the invention and the accompanying drawings.

SUMMARY OF THE INVENTION

The present invention comprises an RF chain for supplying a high-frequency signal to an atomic beam tube and for generating a standard frequency signal. The frequency of the high-frequency signal is controlled by a servo signal. The RF chain includes a first oscillator for generating a first signal having a frequency at least twice that of the standard frequency signal, the frequency of the first signal being responsive to a first control signal. The servo signal is generated from the first control signal. The RF chain also includes an output circuit for generating the standard frequency signal from the first signal. The output circuit includes a frequency division circuit which divides the frequency of the first signal by an integer. In addition, the RF chain includes a frequency multiplication circuit for generating said high-frequency signal from said first signal. In the preferred embodiment of the present invention, the first control signal is generated by a circuit comprising a low-frequency crystal stabilized oscillator, a digital divide circuit for generating a second signal having a frequency equal to that of the first signal divided by an integer, and a phase detector for generating the first control signal in response to the phase difference between the output of the crystal controlled oscillator and the second signal. The output of the phase detector provides the first control signal.

DETAILED DESCRIPTION OF THE INVENTION

Figure 1:
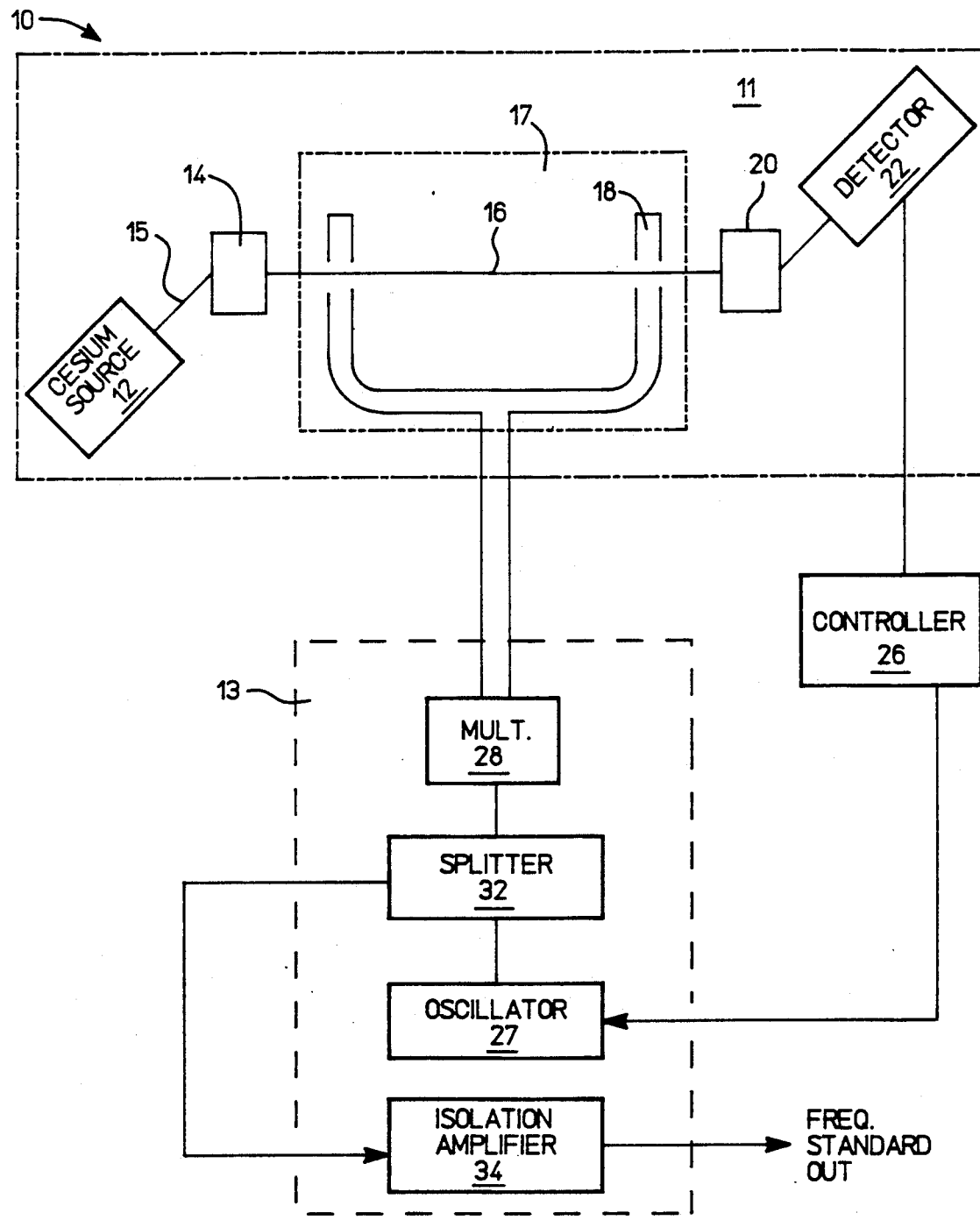
FIG. 1 is a block diagram of the key features of a prior art cesium beam frequency standard apparatus.

To appreciate the manner in which the present invention differs from prior art RF chains, the manner in which a prior art cesium beam frequency apparatus operates will first be explained. A block diagram of the key features of a prior art cesium beam frequency standard apparatus are shown in FIG. 1 at 10. Apparatus 10 includes a cesium beam tube 11, an RF chain 13, and a controller 26. The cesium beam tube operates as follows. A cesium source 12 generates a collimated beam of cesium atoms. Such atomic beam sources are well known to those skilled in the art, and hence, will not be discussed in detail here. For the purpose of the present discussion, it is sufficient to note that the resultant beam of cesium atoms 15 includes atoms in many different energy states. A magnetic state selector 14 is used to select those atoms having energies in a predetermined energy state. The selected cesium atoms pass through a chamber 17 having a small magnetic field referred to as the C-field. Chamber 17 also includes a microwave cavity 18 through which the selected cesium atoms pass. Cavity 18 has two branches to provide Ramsey excitation, which sharpens the resonance. The microwaves cause some fraction of the cesium atoms to change energy state. Hence, upon exiting chamber 17, cesium beam 16 will have atoms in a number of different energy states. The atoms in the desired energy state are selected with the aid of a second magnetic state selector 20. The output of state selector 20 is quantified by detector 22 whose output is read by controller 26.

RF chain 13 provides the microwaves that are introduced into cavity 18. The frequency of the microwaves is controlled by a voltage-controlled crystal oscillator 27 which is under the control of controller 26. Oscillator 27 is often a 10 MHz oscillator. To generate the microwave frequencies needed for beam tube 11, the output of oscillator 27 is multiplied by frequency multiplier 28. Frequency multiplier 28 preferably comprises a circuit for multiplying the 10 MHz oscillator frequency by 32 to obtain a frequency of 320 MHz and a circuit for multiplying the 320 MHz by 29 to obtain a frequency of 9,280 MHz followed by a frequency offset circuit of about 87 MHz to obtain the 9,192 MHz signal.

Controller 26 constantly adjusts the frequency of oscillator 27 by a servo strategy which attempts to maximize the output of detector 22. When this goal is met, the output of oscillator 27 will be at the frequency standard. This output is provided to the user via a splitter 32 and isolation amplifier 34. As noted above, isolation amplifier 34 may introduce a temperature dependent phase shift into the frequency standard signal. If the temperature is changing with time, the temperature dependent phase shift will cause the phase to change with time. This will result in a frequency error that is proportional to the rate of change of the phase. The greater the isolation provided by isolation amplifier 34, the greater the unwanted phase shift. If less isolation is utilized, the equipment connected to the frequency standard apparatus can introduce sidebands into the RF chain via splitter 32 or load the RF chain in a manner that causes transient phase shift. Both of these conditions can lead to errors in the frequency standard.

In addition, the frequency standard output from isolation amplifier 34 is separated from the microwave frequency by multiplier 28. The servo strategy employed by controller 26 guarantees that the microwave frequency at the input to microwave cavity 18 is equal to the resonance frequency. The need to multiply the output of oscillator 27 by almost a factor of 1000 makes it difficult to tie the microwave frequency rigidly to the oscillator frequency. As noted above, multiplier 28 can introduce temperature dependent phase shifts into the RF chain. Since controller 26 adjusts oscillator 27 such that the microwave frequency is correct even after this variable phase shift is introduced, oscillator 27 will be in error during the period of time in which the phase shift is changing.

Figure 2:
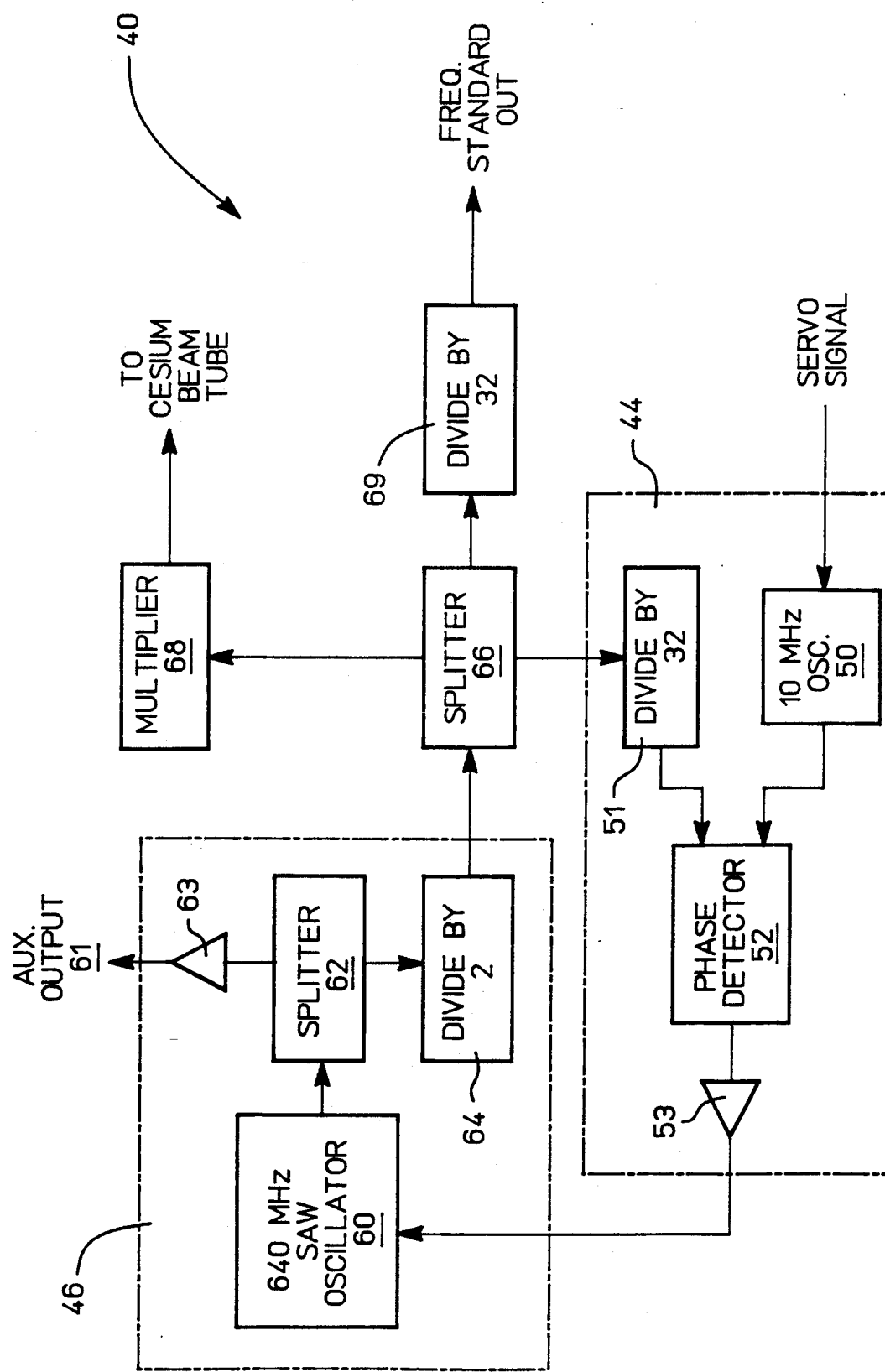
FIG. 2 is a block diagram of an RF chain 40 according to the present invention.

An RF chain according to the present invention greatly reduces these problems and, in addition, provides a much more flexible output signal. FIG. 2 is a block diagram of an RF chain 40, according to the present invention. RF chain 40 utilizes two oscillators, a low-frequency crystal stabilized oscillator assembly 44 and a high-frequency oscillator 46. In the preferred embodiment of the present invention, low-frequency oscillator assembly 44 includes a 10 MHz crystal stabilized oscillator 50 whose frequency is controlled by a servo signal from the controller such as controller 26 described above. Low-frequency oscillator assembly 44 acts as a means for receiving and coupling the servo signal generated by controller 26 to the control input of high-frequency oscillator 46 and stabilizes the output of oscillator 46 between servo signal updates. Low-frequency oscillator 44 also includes a means for locking the phase of high-frequency oscillator 46 to that of oscillator 50. The phase locking is provided by phase detector 52 and divide by 32 circuit 51. The output of low-frequency oscillator 44 is used to control the frequency of high-frequency oscillator 46 via error amplifier 53.

High-frequency oscillator 46 is preferably constructed from a 640 MHz surface acoustical wave oscillator (SAW) 60. In the preferred embodiment, a divide by 2 circuit 64 is used to reduce the frequency of SAW 60 to 320 MHz. This configuration is preferred because 640 MHz SAW oscillators are readily available. However, it will be apparent to those skilled in the art that high-frequency oscillator 46 could be replaced by a single 320 MHz SAW oscillator. The 320 MHz output of high-frequency oscillator 46 is split by splitter 66. One output of splitter 66 is input to multiplier 68 which is used to drive the Cesium beam tube. A second output of splitter 66 is input to a divider 69 which reduces the frequency to the conventional 10 MHz output frequency. The third output of splitter 66 is used to generate the phase locking signal used by low-frequency oscillator assembly 44.

Having explained the physical arrangement of the components of RF chain 40, the manner in which it provides its advantages over the prior art will now be explained. First, it should be noted that multiplier 68 operates on a 320 MHz signal; hence, the amount of multiplication needed is reduced by a factor of 32 relative to prior art designs. This reduction in the multiplication factor makes it possible to utilize multiplication circuits with significantly reduced temperature problems. In addition, the SAW oscillator has lower phase noise than the conventional crystal controlled oscillators multiplied up to the same frequency, and hence, provides a superior microwave signal to the cesium beam tube.

The higher frequency of the SAW oscillator also allows the use of a digital divide circuit 69 for the purpose of isolating external equipment from the RF chain. The divide circuit provides excellent isolation without introducing significant temperature dependent phase shifts. In addition, a high-pass filter can be introduced between splitter 66 and multiplier 68 to provide additional isolation of the 10 MHz signal from the 320 MHz signal used to drive the cesium beam tube. Such a filter would eliminate any 10 MHz signal energy that leaked back through the divide by 32 circuit.

The higher frequency also allows the synthesis of the conventional 10 MHz output via digital synthesis. In this case, the divide by 32 circuit 69 is replaced by a divide by 4 circuit and the resulting 80 MHz square wave used to drive a 3-bit direct digital synthesizer. Such synthesizers have negligible harmonics of 10 MHz at 20, 30, 40, 50 and 60 MHz. The first significant undesirable harmonic is at 70 MHz. These harmonics may be easily removed by a low-pass filter with a cut-off frequency below 70 MHz. Such filtering is easily accomplished without introducing excessive phase drift. As will be explained in more detail below, this aspect of the present invention makes possible the generation of programmable output frequencies with a single low-pass filter.

As noted above, it is often advantageous to provide a high-frequency output. For example, some applications involve generating frequencies in the microwave or millimeter wave frequencies from the frequency standard provided by the present invention. The present invention provides an auxiliary output 61 at 640 MHz. The relative phase drift of this output with respect to the cesium beam tube signal is even less than that of the 10 MHz output. Hence, this output will tolerate even faster temperature shifts than the 10 MHz output. This output also has less phase noise than an equivalent frequency output constructed by frequency multiplying the 10 MHz output, since the SAW oscillator has significantly reduced phase noise.

Figure 3:
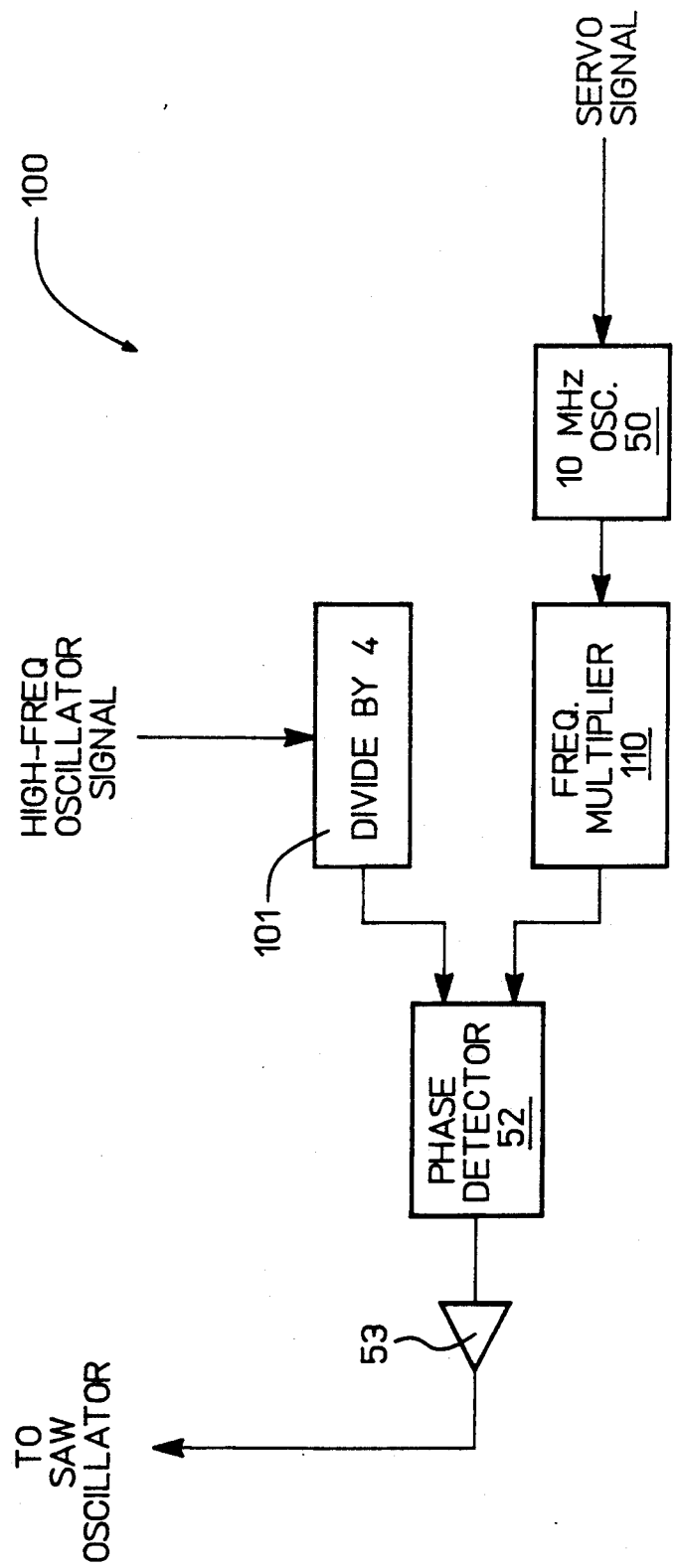
FIG. 3 is a block diagram of an alternative embodiment for low-frequency oscillator assembly 44 shown in FIG. 2.

A block diagram for an alternative embodiment for low-frequency oscillator assembly 44 is shown in FIG. 3 at 100. Oscillator assembly 100 differs from low-frequency oscillator assembly 44 in that divide circuit 51 has been replaced by divide circuit 101 which divides the high-frequency oscillator signal by 4 instead of 32. To compensate for this, the output of oscillator 50 is multiplied by a factor of 8 by frequency multiplier 110. This allows phase detector 52 to operate at 80 MHz. This arrangement reduces the phase noise. It should be noted that any phase drift in the output of frequency multiplier 110 has the same effect as frequency drift in oscillator 50. Since the servo loop adjusts the system to remove such frequency drifts, the phase drift in question does not produce an error.

In principle, the advantages obtained by using a higher frequency oscillator could be obtained in prior art systems by increasing the frequency of the crystal controlled oscillator to 320 MHz. Unfortunately, crystal controlled oscillators in this frequency range are not sufficiently stable. If the crystal controlled oscillator in a conventional system were replaced by a SAW oscillator, the resulting system would also be inferior to the present invention, since the stability of the crystal control would be lost for averaging times between 0.1 and 100 seconds. The crystal controlled oscillator acts as a "flywheel" to stabilize the frequency between frequency updates from the servo loop.

Figure 4:
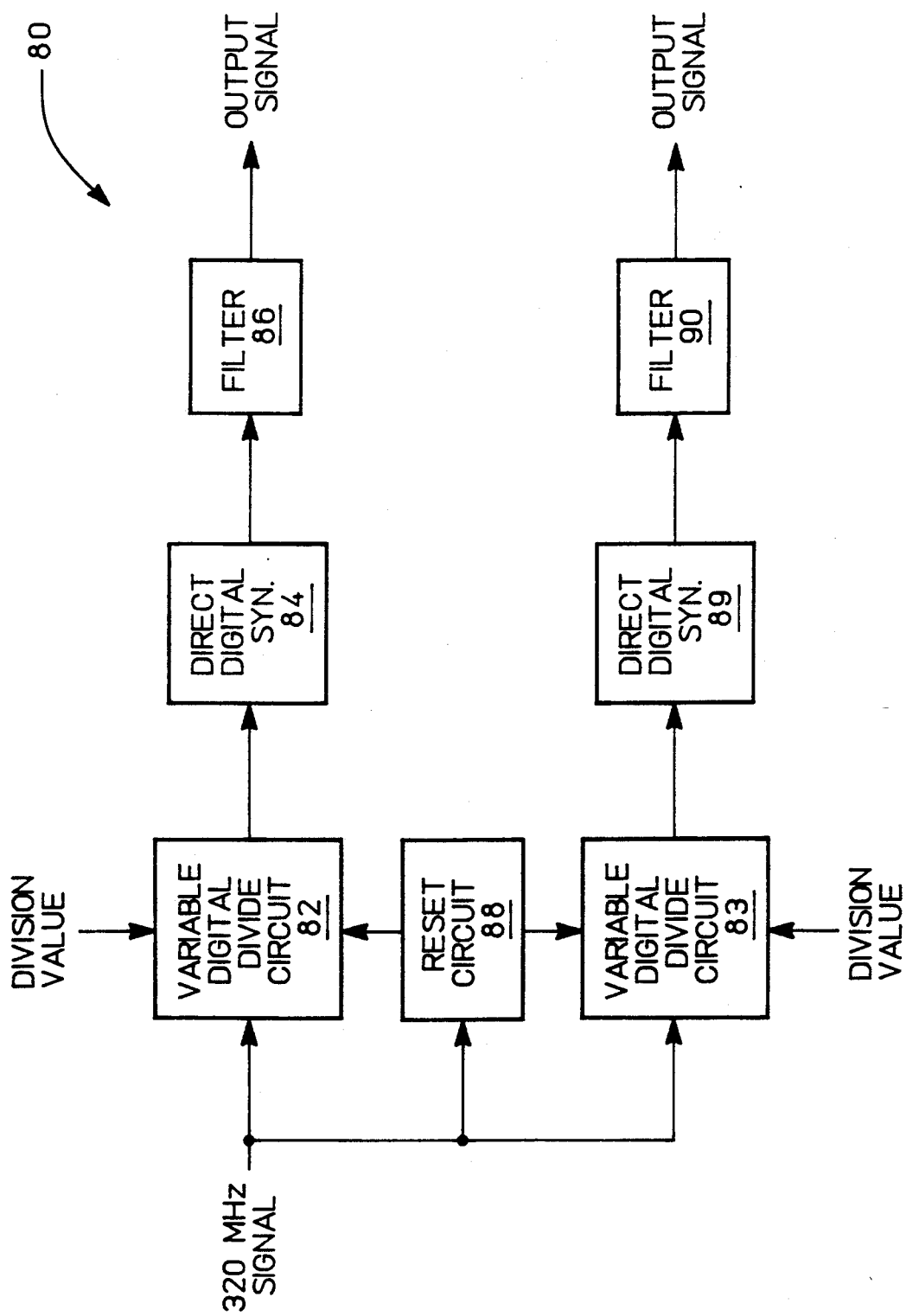
FIG. 4 is a block diagram of a variable output circuit 80 for providing either a 5 MHz or a 10 MHz output signal from the 320 MHz signal.

As noted above, the use of the high-frequency oscillator makes possible the generation of a number of output signals by direct digital synthesis from the 320 MHz signal. FIG. 4 is a block diagram of a variable output circuit 80 for providing two synchronized output signals from the 320 MHz signal. For the purposes of this discussion, each output signal will be assumed to be either 5 or 10 MHz; however, the present invention can be used for generating other output frequencies as explained in more detail below. Output circuit 80 replaces divide by 32 circuit 69 shown in FIG. 2. Each output is generated by dividing the 320 MHz to generate a signal which is used to clock a direct digital synthesizer. The first output signal is generated by variable divide circuit 82 which divides the 320 MHz either by 4 or 8 depending on the desired output frequency, a 3-bit direct digital synthesizer 84, and an output filter 86 for removing unwanted harmonics from the synthesized signal. Similarly, the second output signal is generated by variable divide circuit 83 which divides the 320 MHz either by 4 or 8 depending on the desired output frequency, a 3-bit direct digital synthesizer 89, and an output filter 90 for removing unwanted harmonics from the synthesized signal. The lowest frequency harmonic that must be eliminated from the output of the direct digital synthesizers is 35 MHz; hence, a low-pass filter with a cut-off between 10 MHz and 35 MHz may be used for filters 86 and 90 independent of the choice of output frequency.

It should be noted that in switching between output frequencies, phase errors may be introduced. For example, if variable divide circuit 82 is switched from a division by 8 to a division by 4, the switch could take place during any of the 8 possible states of the counter in the divide circuit. Hence, if one were merely to reset the counter when the switch was made, a phase error would result 7 out of 8 times. To avoid such phase errors, the present invention utilizes a reset circuit 88 which guarantees that changes in the divide ratio take place at a predictable time and, thus, assures that the two output signals remain synchronized. In addition, reset circuit 88 assures phase coherency in each output signal when the frequency of the output signal in question is altered.

Reset circuit 88 includes a counter which acts as a "phase memory". This counter runs at the lowest available output frequency. All output frequencies must be a multiple of this lowest frequency or equal to it. The counters in variable divide circuits 82 and 83 are reset on a predetermined state of this counter when a rate change is signaled by a new division value.

While the present invention has been described with reference to specific frequencies for the various oscillators, it will be apparent to those skilled in the art that other frequency combinations can also be used.

There has been described herein a novel RF chain for use in an atomic clock. Various modifications to the present invention will become apparent to those skilled in the art from the foregoing description and accompanying drawings. Accordingly, the present invention is to be limited solely by the scope of the following claims.

What is claimed is:

1. An RF chain for supplying a high-frequency signal to an atomic beam tube and for generating a standard frequency signal, said high-frequency signal being determined by a servo signal coupled to said RF chain, said RF chain comprising:

first oscillator means for generating a first signal having a frequency at least twice that of said standard frequency signal, the frequency of said first signal being responsive to a first control signal;

means for receiving a servo signal and for generating said first control signal therefrom;

output means for generating said standard frequency signal from said first signal, said output means comprising means for dividing said frequency of said first signal by an integer; and frequency multiplication means for generating said high-frequency signal from said first signal.

2. The RF chain of claim 1 wherein said receiving means comprises:

second oscillator means for generating a second signal having a frequency less than or equal to one half of said first signal, said frequency of said second signal being responsive to said servo signal;

second frequency division means, including means for receiving said first signal, for generating a third signal having a frequency which is equal to said first signal divided by an integer; and phase detection means, including means for receiving said second and third signals, for generating a signal related to the difference of the phases of said second and third signals.

3. The RF chain of claim 2 wherein said second oscillator means further comprises frequency multiplication means for generating said second signal from a lower frequency signal.

4. The RF chain claim 2 wherein said second oscillator means comprises a crystal stabilized voltage controlled oscillator.

5. The RF chain of claim 1 wherein said first oscillator means comprises a surface acoustical wave oscillator.

6. The RF chain of claim 1 wherein said output means comprises a digital frequency divider for generating a fourth signal having a frequency greater than said standard frequency signal by dividing the frequency of said first signal by an integer and a direct digital synthesizer for generating said standard frequency signal from said fourth signal.

7. The RF chain of claim 6 wherein said digital frequency divider in said output means comprises means for receiving a signal specifying said integer and wherein said output means further comprises means for synchronizing said divider with said first signal in response to the receipt of said integer value.

* * * * *